(12) United States Patent
Ramamoorthy

(10) Patent No.: US 8,869,014 B2
(45) Date of Patent: Oct. 21, 2014

(54) MULTI-LEVEL SIGNAL MEMORY WITH LDPC AND INTERLEAVING

(75) Inventor: Aditya Ramamoorthy, Santa Clara, CA (US)

(73) Assignee: Marvell World Trade Ltd., St. Michael (BB)

( * ) Notice: Subject to any disclaimer, the term of this patent is extended or adjusted under 35 U.S.C. 154(b) by 539 days.

(21) Appl. No.: 13/169,790

(22) Filed: Jun. 27, 2011

(65) Prior Publication Data

US 2011/0258509 A1      Oct. 20, 2011

Related U.S. Application Data

(63) Continuation of application No. 11/627,250, filed on Jan. 25, 2007, now Pat. No. 7,971,130.

(60) Provisional application No. 60/788,291, filed on Mar. 31, 2006.

(51) Int. Cl.
*H03M 13/27* (2006.01)
*G06F 11/10* (2006.01)
*H03M 13/25* (2006.01)
*H03M 13/11* (2006.01)
*G11C 11/56* (2006.01)

(52) U.S. Cl.
CPC ......... *H03M 13/255* (2013.01); *G11C 11/5621* (2013.01); *G06F 11/1072* (2013.01); *H03M 13/11* (2013.01)
USPC ............................. 714/785; 714/774; 714/780

(58) Field of Classification Search
CPC .................................................... H03M 13/151
USPC .......... 714/785, 774, 780, 755, 778, 747, 752
See application file for complete search history.

(56) References Cited

U.S. PATENT DOCUMENTS

| | | | |
|---|---|---|---|
| 6,125,050 A | 9/2000 | Hofmann et al. | |
| 7,243,287 B2 * | 7/2007 | Cameron et al. | 714/752 |
| 7,281,192 B2 * | 10/2007 | Shen et al. | 714/757 |
| 7,373,581 B2 | 5/2008 | Okamura et al. | |
| 7,421,041 B2 | 9/2008 | Khandekar et al. | |

(Continued)

FOREIGN PATENT DOCUMENTS

| | | |
|---|---|---|
| JP | 2005078721 A | 3/2005 |
| JP | 2005525019 A | 8/2005 |

OTHER PUBLICATIONS

Sankara, et al., "Design of Low-density parity-check (LDPC) codes for high order constellations", Proceedings of the Global Telecommunications Conference 2004, Dallas, TX, vol. 5, Nov. 29, 2004, pp. 3113-3117.

(Continued)

*Primary Examiner* — Fritz Alphonse

(57) ABSTRACT

Embodiments of the present invention provide multi-level signal memory with LDPC and interleaving. Thus, various embodiments of the present invention provide a memory apparatus that includes a memory block comprising a plurality of memory cells, each memory cell adapted to operate with multi-level signals. Such a memory apparatus also includes a low density parity check (LDPC) coder to LDPC code data values to be written into the memory cells and an interleaver adapted to apply bit interleaved code modulation (BICM) to the LDPC coded data values to generate BICM coded data values. Other embodiments may be described and claimed.

19 Claims, 6 Drawing Sheets

(56) References Cited

U.S. PATENT DOCUMENTS

| | | | |
|---|---|---|---|
| 7,516,390 B2 | 4/2009 | Shen et al. | |
| 7,760,880 B2 * | 7/2010 | Dave et al. | 380/240 |
| 8,006,172 B2 * | 8/2011 | Boyer et al. | 714/786 |
| 8,020,063 B2 * | 9/2011 | Olaker et al. | 714/755 |
| 8,122,315 B2 * | 2/2012 | Choi et al. | 714/758 |

OTHER PUBLICATIONS

International Standard, Information technology—Telecommunications and information exchange between systems—Local and metropolitan area networks—Specific requirements—Part 11: Wireless LAN Medium Access Control (MAC) and Physical Layer (PHY) specifications, ISOIIEC 8802-11:1999(E), ANSI/IEEE, Std 802.11, 1999 edition, 531 pages.

Supplemental to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-speed Physical Layer in the 5 GHZ Band, IEEE Std 802.11 a-1999, 91 pgs.

Supplemental to IEEE Standard for Information technology—Telecommunications and information exchange between systems—Local and metropolitan area networks—Specific requirements—Part 11: Wireless LAN Medium Access Control (MAC) and Physical Layer (PHY) specific.atiens: Higher-Speed Physical Layer Extension in the 2.4 HGz Band, IEEE Std 802.11b-1999, 96 pgs.

IEEE Standard for Information technology—Telecommunications and information exchange between systems—Local and metropolitan area networks—Specific requirements—Part11: Wireless LAN Medium Access Control (MAC) and Physical Layer (PHY) specifications: Amendment 2: Higher-Speed Physical Layer (PHY) extension in the 2.4 HGz Band—Corrigendum 1, IEEE Std 802.11 b-1999/Cor 1-2001, 23 pgs.

IEEE Standard for Information technology—Telecommunications and information exchange between systems—Local and metropolitan area networks—Specific requirements—Part 11: Wireless LAN Medium Access Control (MAC) and Physical Layer (PHY) specifications: Amendment 7: Medium Access Control (MAC) Quality of Service (QoS) Enhancements, IEEE 802.11 e/D11.0, Oct. 2004, 195 pgs.

IEEE P802.119/D8.2, DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the.2.4 GHz Band, Apr. 2003, 69 pgs.

DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band, IEEE Std 802.11g/D2.8, May 2002, 53 pgs.

IEEE P802.11g/D8.2, DRAFT Supplement to STANDARD [for] InformationTechnology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band, Apr. 2003, 69 pgs.

802.11 h, IEEE Standard for Information technology—Telectommunications and information exchange between systems—Local and metropolitan area networks—Specific requirements—Part 11: Wireless LAN Medium Access Control (MAC) and Physical Layer (PHY) specifications, Amendment 5: Spectrum and Transmit Power Management Extensions in the 5 GHz band in Europe, IEEE Std 802.11 h-2003, 75 pgs.

802.11h, IEEE Standard for Information technology—Telectommunications and information exchange between systems—Local and metropolitan area networks—Specific requirements, Part 11: Wireless LAN Medium Access Control (MAC) and Physical Layer (PHY) specifications, Amendment 6: Medium Access Control (MAC) Security Enhancements, IEEE Std 802.11 i-2004, 190 pgs.

DRAFT Supplement to STANDARD for Information Technology—Telecommunications and Information Exchange Between Systems•LAN/MAN Specific Requirements•Part 11: Wireless LAN Medium Access Control (MAC) and Physical Layer (PHY) specifications: Specification for Enhanced Security, IEEE Std 802.11 i/D3. 0, Nov. 2002, 211 pgs.

IEEE P802.11, Wireless LANs, TGn Sync Proposal Technical Specification, May 18, 2005, IEEE 804.11-04/08898r6, 131 pgs.

Lou H-L et al: "Coded Modulation to Increase Storage Capacity of Multilevel Memories", Proc. IEEE Globecom 1998, vol. 6, 1998, pp. 3379-3384, XP000805261.

Gregori S et al: "Construction of polyvalent error control codes for multilevel memories", Proc. Intern. Conference on Electronics, Circuits and Systems, vol. 2, Dec. 17, 2000, pp. 751-754, XP010535817.

Rossi 0 et al: "Fast and compact error correcting scheme for reliable multilevel flash memories", Proceedings of the Eighth IEEE International On-Line Testing Workshop, Jul. 8, 2002, pp. 221-225, XP010601444.

Zhang Zhi et al: "Low-density parity-check codes and high spectral efficiency modulation", Proc. Personal, Indoor and Mobile Radio Communications Conference, Sep. 7, 2003, pp. 444-448, XP010681635.

Hsi-Chia Chang et al: "Multi-level memory systems using error control codes", Proceedings of the 2004 International Symposium on Circuits and Systems, vol. 2, May 23, 2004, pp. 393-396, XP010720188.

Winstead C: "Analog Soft Decoding for Multi-Level Memories", Proceedings 35th International Symposium on Multiple-Valued Logic, May 19, 2005, pp. 132-137, XP010798331.

Hou, et al., "Capacity-Approaching Bandwidth-Efficient Coded Modulation Schemes Based on Low-Density Parity-Check Codes", IEEE Transactions on Information Theroy, IEEE Information Theory Society, Sep. 2003, vol. 49, No. 9, pp. 2141-2155.

\* cited by examiner

MULTI-LEVEL SIGNAL MEMORY WITH LDPC AND INTERLEAVING

CROSS REFERENCE TO RELATED APPLICATIONS

This present disclosure is a continuation of U.S. application Ser. No. 11/627,250, filed on Jan. 25, 2007, which claims priority under 35 U.S.C §119(e) to U.S. Provisional Application No. 60/788,291, filed on Mar. 31, 2006.

TECHNICAL FIELD

Embodiments of the present invention relate to the field of integrated circuits, and more particularly, to providing multi-level signal memory with LDPC and interleaving.

BACKGROUND

In order to increase memory capacity, manufacturers have continually moved memory chip or on-chip memory (such as flash memory) production to smaller process geometries over the last few years. Recently, multi-level signal memory cells have been used to increase flash memory capacity. In such an arrangement, a cell is configured to produce distinct signal threshold levels, which results in distinct read-back levels. With four level signals available per cell, two bits may be included into each flash memory cell. One problem with writing with four signal levels into each cell is that the distinction between adjacent levels may become difficult to discern. This is often referred to in the art as reduced signal distance (often shown as reduced $D_{min}$).

When writing a signal level to a given cell, there is generally an amount of uncertainty in the written-in signal level. When the probable distribution of each signal level overlaps the probable distribution of adjacent signal level, the signal level generally may not be determined by using a simple prior art slicer circuit. This results in a limit on the number of signal levels that may be employed to write into every cell. At present, the state of the art is four signal levels, or two bits per cell.

SUMMARY

In accordance with various embodiments of the present invention, a memory apparatus includes a memory block comprising a plurality of memory cells, each memory cell adapted to operate with multi-level signals. The memory apparatus also includes a low density parity check (LDPC) coder to LDPC code data values to be written into the memory cells and an interleaver adapted to apply bit interleaved code modulation (BICM) to the LDPC coded data values to generate BICM coded data values.

In accordance with various embodiments, the memory apparatus further includes a controller adapted to control the coding by the LDPC coder, the interleaving by the interleaver, and the receiving of the of the multi-level signals by the memory block.

In accordance with various embodiments, the memory apparatus further includes a mapper to map the BICM coded data values to modulation codes in accordance with a constellation map.

In accordance with various embodiments, the constellation map is based upon Gray code.

In accordance with various embodiments, the constellation map comprises 8 modulation codes.

In accordance with various embodiments, a set of least significant bits is mapped to a modulation code corresponding to a lowest transmission voltage level, and a set of most significant bits is mapped to a modulation code corresponding to a highest transmission voltage level.

In accordance with various embodiments, the memory apparatus further includes a pulse amplitude modulator (PAM) operatively coupled to the interleaver and the memory block to modulate the multi-level signals for the memory block.

In accordance with various embodiments, the memory apparatus further includes a channel block that comprises the interleaver and the PAM.

In accordance with various embodiments, the memory apparatus further includes a channel block that comprises the interleaver and at least one of the LDPC coder or the mapper.

In accordance with various embodiments, at least the memory block is configured as a flash memory device.

In accordance with various embodiments, the memory block comprises one of a floating gate device, oxide-nitride-oxide (ONO) charge trapping device or a phase change memory device.

In accordance with various embodiments, the memory apparatus further includes a pulse amplitude modulator (PAM) and a digital bus interface operatively coupled to the PAM and the memory block, wherein the PAM is adapted to output multi-level signals to the memory block serially.

In accordance with various embodiments, the memory apparatus further includes a de-interleaver operatively coupled to the memory block to deinterleave BICM coded data values from multi-level signals received from the memory block.

In accordance with various embodiments, the memory apparatus further includes a LDPC decoder operatively coupled to the de-interleaver to decode the data values from the de-interleaved LDPC coded data values.

In accordance with various embodiments, the memory apparatus further includes a channel block that comprises the de-interleaver and the LDPC decoder.

In accordance with various embodiments of the present invention, a method includes coding a plurality of multi-level signal data values with corresponding low density parity (LDPC) codes, interleaving the LDPC coded multi-level signal data values with bit interleaved code modulation (BICM), and outputting the interleaved LDPC coded data values for storage using multi-level signals.

In accordance with various embodiments of the present invention, a method includes receiving a coded multi-level signal data value, wherein the coded multi-level signal data value has been coded with a low density parity check code (LDPC) and interleaved with bit interleaved code modulation (BICM), and decoding the coded multi-level signal data value to recover a multi-level signal data value.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide multi-level signal memory with LDPC and interleaving.

Figure 1:
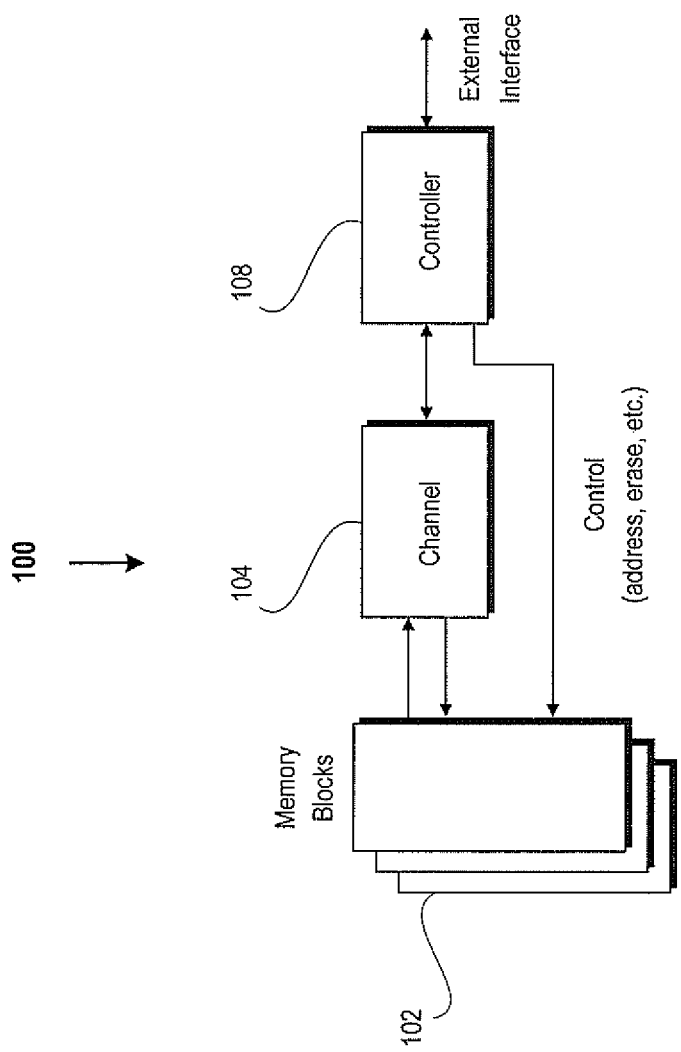
FIG. 1 schematically illustrates a memory arrangement in accordance with various embodiments of the present invention.

In general, a block diagram of a memory arrangement 100, in accordance with various embodiments of the present invention, is illustrated in FIG. 1. Memory arrangement 100 includes one or more memory blocks 102 that each includes memory cell arrays, as well as read and write circuits. Memory arrangement 100 also includes a channel block 104 that performs signal processing used to decode signal levels received from memory blocks 102. In accordance with various embodiments, channel block 104 also performs signal processing to code various data values to write into memory blocks 102. A controller 108 is provided to interface to external system(s) to receive and send data signals through its external data interface, to and from channel block 104. Controller 106 performs various tasks including tasks that direct where data values need to be written into or read from memory blocks 102 depending upon command instructions received through its external interface. In various embodiments, memory blocks 102 may be flash memory blocks.

In accordance with various embodiments of the present invention, a high gain coding such as, for example, trellis coded modulation (TCM) is used by channel block 104 to code and/or decode multi-level signal data values to and/or from a memory block. The addition of TCM imposes a certain constraint as to what sample sets may be adjacent to a previous and a future sample sequence. Various codes may be used to allow multi-level signals data values with a spread distribution that reduces overlaps with one another, enabling the multi-level signals data values to be more likely detected correctly, using e.g. maximum likelihood detection and decoding with trellis coding. Pulse Amplitude Modulation code (PAM), Quadrature Amplitude Modulation code (QAM) and Low Density Parity Check code (LDPC) are examples of codes that may be used. By encoding the multi-level signal data values with high gain coding and/or one or more of PAM, QAM and LDPC, a higher reliability of reading and writing the multi-level signals may be achieved within each memory cell, which in turn may lead to increase in data density of a memory array (reduce usage of memory cells for auxiliary information).

Figure 2:
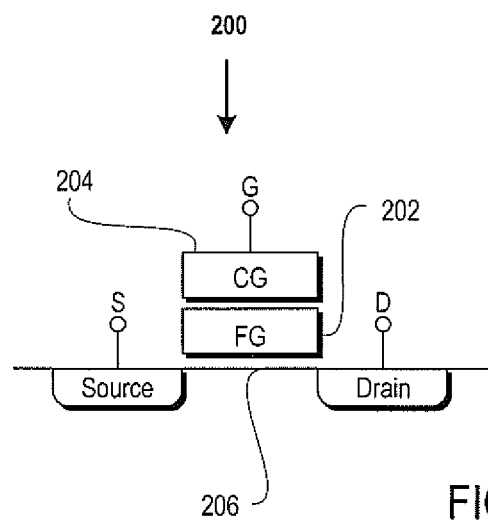
FIG. 2 schematically illustrates an exemplary transistor for a flash memory cell suitable for use to practice various embodiments of the present invention.
Figure 3:
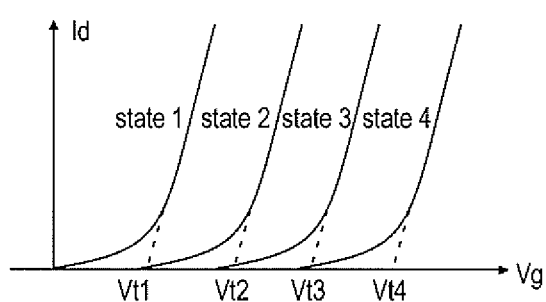
FIG. 3 is a graph illustrating transistor characteristics corresponding to different charge levels.
Figure 4:
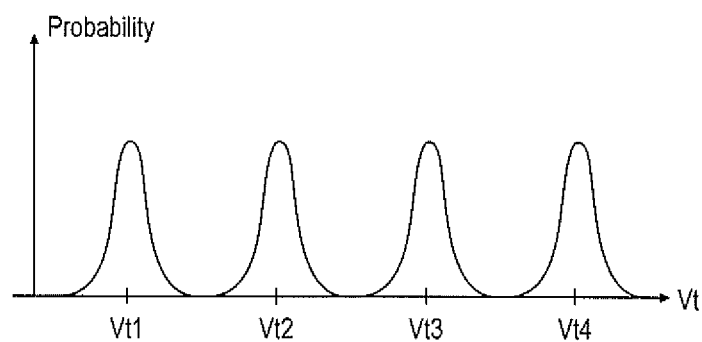
FIG. 4 is a graph illustrating a probability density distribution for the threshold voltage of a system of four charge level flash memory cells.

Generally, an exemplary flash memory cell, in accordance with various embodiments of the present invention and depicted in FIG. 2, includes an insulated gate transistor 200 that includes a floating gate 202 between the channel 204 and the control gate 206. Charge trapped in floating gate 202 modifies the turn-on threshold voltage. The transistor characteristics are illustrated in FIG. 3, corresponding to different charge levels stored on floating gate 202. With devices that include a plurality of memory cells arranged in arrays, many parameters that naturally vary from one device to another due to imperfect process control may affect the programmed threshold of the device. Consequently, if one were to write to many devices targeting a certain threshold value, the end result is a distribution of target threshold values instead of the desired distinct target threshold values. FIG. 4 illustrates a typical probability density function (PDF) for the target threshold voltages of a system of flash memory cells, each cell having four target charge levels.

Figure 5:
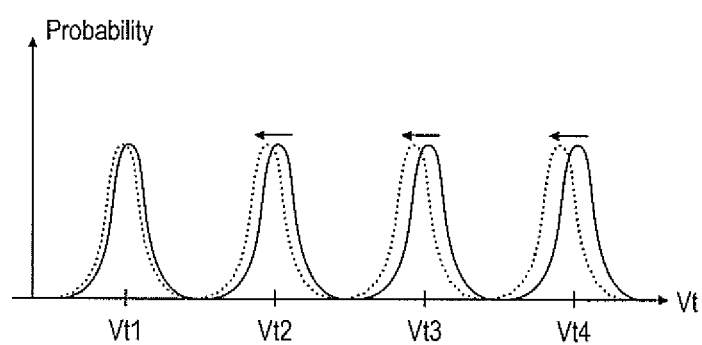
FIG. 5 is a graph illustrating the shift profile for the probability distribution for the threshold voltage of a system of four charge level flash memory cells.

Over time, the charge trapped in floating gate 202 generally leaks slowly and the threshold voltage may shift back towards a lower value. While the leakage is generally slow, the specification for any commercially acceptable storage device requires the data to be readable even after a ten-year period. The rate of leakage of the floating gate charge is dependent upon the voltage on floating gate 202. FIG. 5 illustrates a typical shift profile for the threshold PDF over time. Furthermore, the physics of charge leakage in a memory cell is such that each signal level may leak at a different rate from the others. As such, over time, the signal levels generally will not drop at the same rate.

Thus, as an example, in accordance with various embodiments of the present invention, in a write mode, multi-level signals that are employed to write various data into memory cells within the memory block are encoded with the high gain coding. The high gain encoded data signals are output to the memory blocks to write data into the memory block cells.

During a read mode, in accordance with various embodiments of the present invention, memory blocks 102 responsive to the commands of controller 108 output data that is stored in at least one memory cell. In accordance with various embodiments, data stored in a whole row of memory cells may be outputted at different read-back signal levels. The multi-level read-back signals for each cell are transferred to channel block 104. If a small interface is desired, the signals may be transferred in a serial fashion. In one embodiment, analog to digital conversion or a digitizing function (not shown), may be performed by an analog to digital converter (ADC) that is included on memory block 102 if inclusion of such ADC is practical. Thus, the signal levels may be transferred as digitized data and sent back to channel block 104 serially. Otherwise, in accordance with various embodiments, analog signals may be transferred back to channel block 104 from memory block 102 as discrete time analog signals. Such transfers, in accordance with various embodiments, may be done serially if desired, or in parallel, in other embodiments. In a serial embodiment, the channel block may either digitize the signal or not based upon whether an analog or digital channel implementation is used. In accordance with various embodiments of the present invention a digital channel implementation is used and thus, the channel block includes an ADC, and memory block 102 and channel block 104 are operatively coupled to one another via a digital bus interface.

Figure 6:
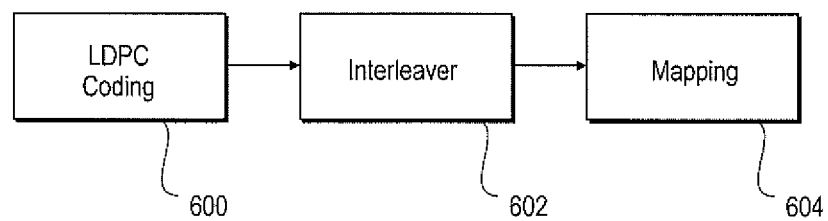
FIG. 6 schematically illustrates a high gain coding scheme in accordance with various embodiments of the present invention.

More particularly, with reference to FIG. 6, a coding scheme in accordance with various embodiments of the present invention includes multi-level signal data values being received at channel block 104 from controller 108. The received data values are encoded with LDPC via LDPC encoder/de-coder 600. The LDPC coded values are then passed through an interleaver 602. The interleaved values are mapped to constellation points by the constellation mapper at 604. Thus, the system implements bit-interleaved coded modulation (BICM). In accordance with various embodiments, Gray code mapping is used. In accordance with various embodiments, the constellation map includes 8 constellation points. Those skilled in the art will understand that fewer constellation points may be used if desired, e.g., 4 or 2 constellation points, or if possible, more constellation points, e.g., 16, 32, etc. The mapped values are transferred from channel block 104 to memory block 102 and written into a memory cell of memory block 102.

In accordance with various embodiments of the present invention, PAM is used to transmit signals between channel block 104 and memory block 102. Thus, in accordance with various embodiments, there are 8 channels for the PAM. As an example, the channels may include −7v, −5v, −3v, −1v, +1v, +3v, +5v and +7v transmission voltage levels. In accordance with various embodiments of the present invention, a least significant bit (e.g. bit 0) represents the lowest or "worst" channel, while a most significant bit (e.g. bit 100) represents the highest or "best" channel.

When data needs to be retrieved from memory block 102, coded multi-level signal data values are transferred from the memory block to channel block 104, where they are decoded. Thus, in accordance with various embodiments, the LDPC encoder/decoder, interleaver and mapper are included with channel block 104.

Thus, with a coding scheme in accordance with various embodiments of the present invention, more levels may be realized on a multi-level memory device since the coding allows for more reliable retrieval of data values from the memory, even with the reduced distance between levels.

Figure 7:
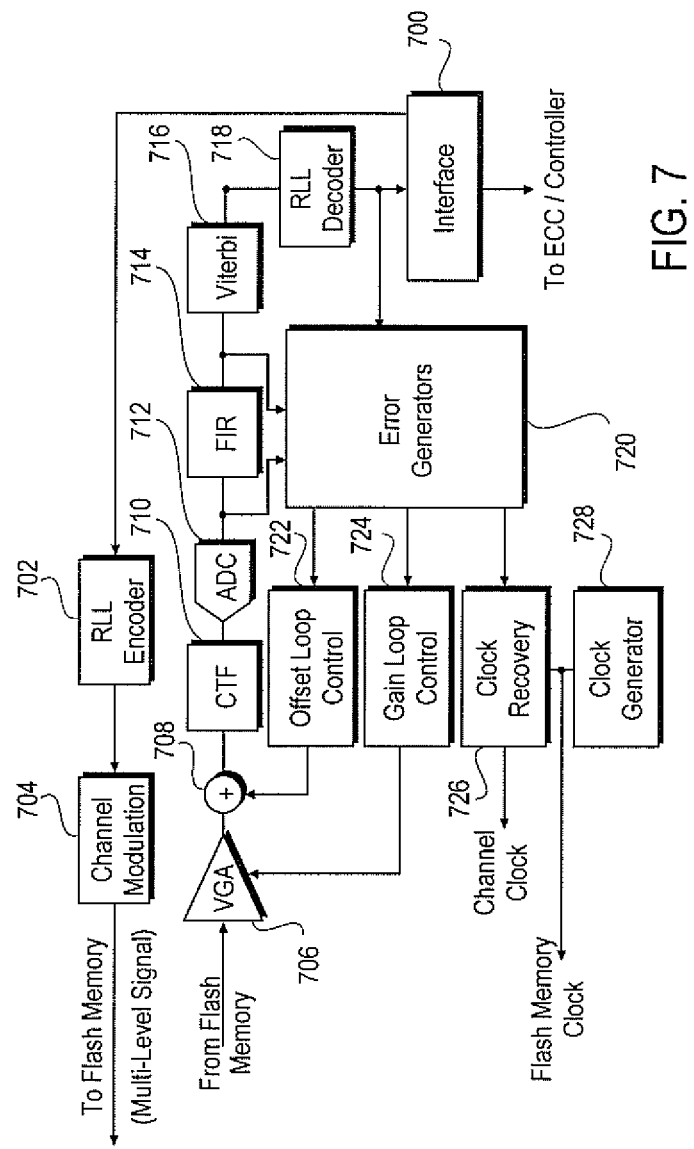
FIGS. 7 and 8 schematically illustrate exemplary channel block implementations in accordance with various embodiments of the present invention.

In accordance with various embodiments, an exemplary channel block 104 may be configured similar to generally known communication or magnetic hard disk drive (HDD) channels, as illustrated in FIG. 7. As may be seen in FIG. 7, such an exemplary channel block 104 may include an interface 700, a run length limited (RLL) encoder 702 and channel modulation 704 along a write path. The exemplary channel block 104 may further include a variable gain amplifier (VGA) 706, an offset setting 708, a continuous time filter (CTF) block 710, an ADC 712, a finite impulse response (FIR) block 714, a Viterbi detector 716, an RLL decoder 718, error generators 720, an offset control loop 722, a gain control loop 724, a clock recovery 726 and clock generator 728 along a read path, coupled to each other substantially as illustrated.

Some simplification may be made from a conventional channel block. For example, since data sampling and transfer, in accordance with various embodiments, are clocked synchronously, there is no need to include a timing recovery circuit (726, 728) in channel block 104. Such a timing recovery circuit may be included if desired such as, for example, for very high data-rate applications. However, generally the sampling clock frequency matches exactly to the incoming data signal frequency and thus, only the delay is potentially unknown. For such a system only a Type I timing recovery loop may be desired.

Additionally, the signal returning from memory block 102 may match well to the target response, i.e., the original signal, such that linear equalizers in the channel block (CTF 710 and FIR 714) may not be necessary. Other functional blocks typical of a communication/HDD channel may be included, in accordance with various embodiments of the present invention, for memory arrangement 100. In particular, as noted above, automatic gain control loop 724, Viterbi detector 716 (with trellis control) and channel encoder/decoder (702, 718) may also be included.

Often, standard deviation in the distribution of each target signal level is different from the others, and the mean distance between two adjacent ideal signal levels may not be constant relative to the design target. Thus, in accordance with various embodiments, Viterbi detector 716 may implement adaptive and non-linear branch metrics calculators (e.g., the Viterbi detector may use a subset non-linear detector algorithm used in magnetic HDD).

Figure 8:
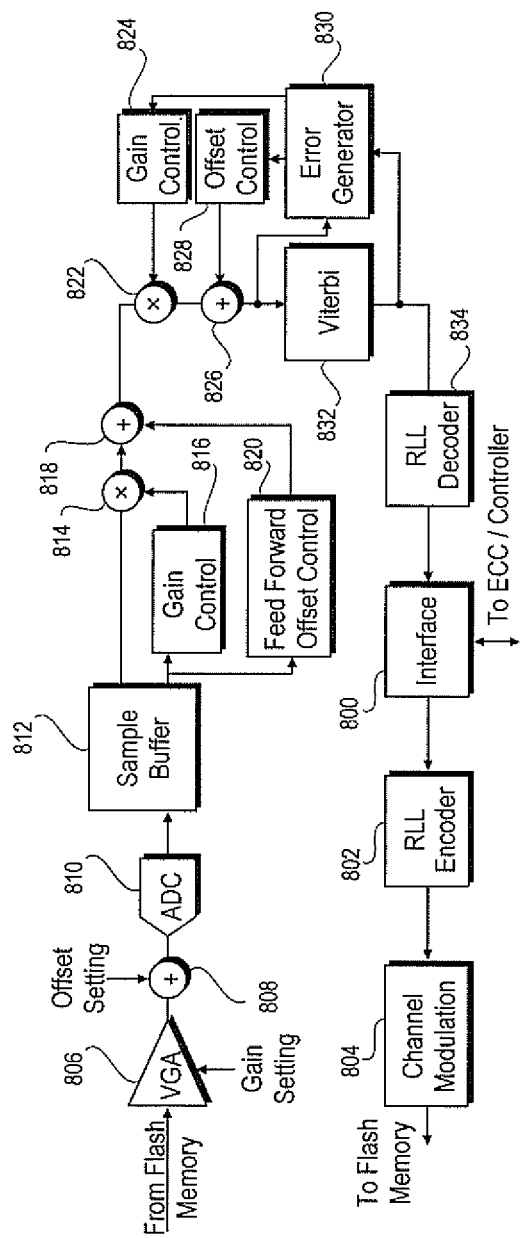

In accordance with various embodiments of the present invention, channel block 104 may also include a sample data buffer capable of storing a large section of data samples so iterative or over-a-block processing may be performed (e.g., block averaging for gain control so that signal levels may become normalized before other processing by the channel block). An example of such an arrangement for channel block 104 is schematically illustrated in FIG. 8. As may be seen, such an exemplary channel block 104 may include an interface 800, RLL encoder 802 and channel modulation 804 along a write path. The exemplary channel block 104 may further include a VGA 806, offset setting 808, ADC 810, sample buffer 812, offset setting 814, gain control 816, offset setting 818, feed forward offset control 820, offset setting 822, gain control 824, offset setting 826, offset control 828, error generator 830, Viterbi detector 832 and RLL decoder 834, coupled to each other substantially as illustrated.

In accordance with various embodiments of the present invention, at least the memory block, and even the entire memory arrangement, is a flash-type memory device. For clarity, the present invention has been substantially described as such, although those skilled in the art will understand that other types of memory may benefit from the present invention. Additionally, in accordance with various embodiments of the present invention, the present invention is useful for many types of memory devices such as, for example and not limited to, floating gate devices, oxide-nitride-oxide (ONO) charged trapping devices, and phase change memory devices.

While the present invention is useful for all types of devices that use memory, it is especially useful for portable electronic devices, such as, for example, mobile phones, laptop computers, personal digital assistants, gaming devices, music players, and video players. In various embodiments, the portable electronic devices may include reduced instruction set (RISC) processors and wireless communication support, such as wireless communication in accordance with one or more of the Institute of Electrical and Electronic Engineer's (IEEE) 802.11 family of standards.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

The invention claimed is:

1. A memory apparatus comprising:
    a memory block comprising a plurality of memory cells, each memory cell configured to operate with multi-level signals;
    a low density parity check (LDPC) coder configured to LDPC encode data values to provide LDPC encoded data values to be written into the memory cells;
    an interleaver configured to interleave the LDPC encoded data values in accordance with bit interleaved code modulation to generate interleaved LDPC encoded data values;
    a pulse amplitude modulator operatively coupled to both (i) the interleaver and (ii) the memory block, the pulse amplitude modulator configured to modulate the interleaved LDPC encoded data values for the memory block; and
    a mapper configured to map the interleaved LDPC encoded data values to modulation codes in accordance with a constellation map,
    wherein the mapper is configured to (i) map a least significant bit to a modulation code corresponding to a lowest channel, and (ii) map a most significant bit to a modulation code corresponding to a highest channel.

2. The memory apparatus of claim 1, further comprising a controller configured to control (i) encoding by the LDPC coder, (ii) interleaving by the interleaver, and (iii) receiving of the multi-level signals by the memory block.

3. The memory apparatus of claim 1, wherein the constellation map is based upon Gray code.

4. The memory apparatus of claim 3, wherein the constellation map comprises 8 modulation codes.

5. The memory apparatus of claim 1, further comprising a channel block that comprises (i) the interleaver and (ii) the pulse amplitude modulator.

6. The memory apparatus of claim 1, further comprising a channel block that comprises (i) the interleaver and (ii) at least one of the LDPC coder or the mapper.

7. The memory apparatus of claim 1, wherein at least the memory block is configured as a flash memory device.

8. The memory apparatus of claim 1, wherein the memory block comprises one of a floating gate device, oxide-nitride-oxide (ONO) charge trapping device or a phase change memory device.

9. The memory apparatus of claim 1, further comprising a digital bus interface operatively coupled to each of the pulse amplitude modulator and the memory block, wherein the pulse amplitude modulator is configured to serially output multi-level signals to the memory block.

10. The memory apparatus of claim 1, further comprising a de-interleaver operatively coupled to the memory block, the de-interleaver configured to de-interleave interleaved LDPC encoded data values from multi-level signals received from the memory block to provide de-interleaved LDPC encoded data values.

11. The memory apparatus of claim 10, further comprising an LDPC decoder operatively coupled to the de-interleaver, the LDPC decoder configured to decode data values from the de-interleaved LDPC encoded data values.

12. The memory apparatus of claim 11, further comprising a channel block that comprises (i) the de-interleaver and (ii) the LDPC decoder.

13. A method comprising:
    encoding, by a low density parity check (LDPC) coder, a plurality of multi-level signal data values with corresponding low density parity (LDPC) codes to provide LDPC encoded multi-level signal data values;
    interleaving, by an interleaver, the LDPC encoded multi-level signal data values in accordance with bit interleaved code modulation to provide interleaved LDPC encoded multi-level signal data values;
    outputting, using multi-level signals, the interleaved LDPC encoded multi-level signal data values for storage in a memory block;
    modulating, by a pulse amplitude modulator, the interleaved LDPC encoded data values for the memory block; and
    mapping, by a mapper, the interleaved LDPC encoded multi-level signal data values to modulation codes in accordance with a constellation map,
    wherein (i) a least significant bit is mapped to a modulation code corresponding to a lowest channel, and (ii) a most significant bit is mapped to a modulation code corresponding to a highest channel.

14. The method of claim 13, wherein the constellation map is based upon Gray code.

15. The method of claim 14, wherein the constellation map comprises 8 constellation points.

16. A method comprising:
    receiving, from a memory block comprising a plurality of memory cells, an encoded multi-level signal data value, wherein the encoded multi-level signal data value has been encoded with a low density parity check code (LDPC) and interleaved with bit interleaved code modulation;
    de-interleaving the encoded multi-level signal data value to provide a de-interleaved encoded multi-level signal data value; and
    decoding the de-interleaved encoded multi-level signal data value to recover a multi-level signal data value,
    wherein the encoded multi-level signal data value has also been mapped to a modulation code in accordance with a constellation map, and
    wherein (i) a least significant bit has been mapped to a modulation code corresponding to a lowest channel, and (ii) a most significant bit has been mapped to a modulation code corresponding to a highest channel.

17. The method of claim 16, wherein:
    a set of least significant bits have been mapped to a modulation code corresponding to a lowest transmission voltage level; and
    a set of most significant bits have been mapped to a modulation code corresponding to a highest transmission voltage level.

18. The method of claim 16, wherein the constellation map is based upon Gray code.

19. The method of claim 18, wherein the constellation map comprises 8 constellation points.

* * * * *